(12) United States Patent
Wang et al.

(10) Patent No.: US 7,230,845 B1
(45) Date of Patent: Jun. 12, 2007

(54) MAGNETIC DEVICES HAVING A HARD BIAS FIELD AND MAGNETIC MEMORY DEVICES USING THE MAGNETIC DEVICES

(75) Inventors: Lien-Chang Wang, Fremont, CA (US); Yiming Huai, Pleasanton, CA (US)

(73) Assignee: Grandis, Inc., Milpitas, CA (US)

(*) Notice: Subject to any disclaimer, the term of this patent is extended or adjusted under 35 U.S.C. 154(b) by 131 days.

(21) Appl. No.: 11/192,811

(22) Filed: Jul. 29, 2005

(51) Int. Cl.
*G11C 11/15* (2006.01)

(52) U.S. Cl. .................. 365/173; 365/171; 365/225.5; 365/158; 360/324.12

(58) Field of Classification Search ................ 365/173, 365/171, 225.5, 158; 360/324.12
See application file for complete search history.

(56) References Cited

U.S. PATENT DOCUMENTS

| | | | |
|---|---|---|---|
| 5,729,410 A * | 3/1998 | Fontana et al. .......... 360/324.2 |
| 5,936,293 A * | 8/1999 | Parkin ......................... 257/422 |
| 6,097,579 A | 8/2000 | Gill ........................... 360/324.2 |
| 6,438,026 B2 | 8/2002 | Gillies et al. ................ 365/158 |
| 6,633,498 B1 | 10/2003 | Engel et al. ................. 365/158 |
| 6,836,392 B2 | 12/2004 | Carey et al. ............ 360/324.11 |
| 2003/0185050 A1* | 10/2003 | Kishi et al. .................. 365/173 |
| 2006/0002184 A1* | 1/2006 | Hong et al. .................. 365/171 |

* cited by examiner

*Primary Examiner*—Son Dinh
*Assistant Examiner*—Toan Le
(74) *Attorney, Agent, or Firm*—Strategic Patent Group P.C.

(57) ABSTRACT

A method and system for providing a magnetic memory device are disclosed. The method and system include providing a magnetic element that includes a data storage layer having at least one easy axis in at least a first direction. The method and system also include providing a hard bias structure surrounding a portion of the magnetic element. The hard bias structure is also configured to provide at least one hard bias field essentially parallel to the at least the first direction or essentially perpendicular to the at least the first direction.

29 Claims, 8 Drawing Sheets

MAGNETIC DEVICES HAVING A HARD BIAS FIELD AND MAGNETIC MEMORY DEVICES USING THE MAGNETIC DEVICES

FIELD OF THE INVENTION

The present invention relates to magnetic memory systems, and more particularly to a method and system for providing a magnetic element having a low write field, improved switching characteristics, and which is suitable for use in a magnetic memory such as a magnetic random access memory (MRAM).

BACKGROUND OF THE INVENTION

FIGS. 1A and 1B depict conventional magnetic elements 10 and 10'. Such conventional magnetic elements 10/10' can be used in non-volatile memories, such as MRAM. The conventional magnetic element 10 is a spin valve and includes a conventional antiferromagnetic (AFM) layer 12, a conventional pinned layer 14, a conventional nonmagnetic spacer layer 16 and a conventional free layer 18. Other layers (not shown), such as seed or capping layer may also be used. The conventional magnetic element 10 also typically has an elliptical shape 11, and thus a shape anisotropy that favors a magnetization that is substantially parallel to the long axis, 1, of the ellipse. The conventional pinned layer 14 and the conventional free layer 18 are ferromagnetic. Thus, the conventional free layer 18 is depicted as having a changeable magnetization 19. The conventional nonmagnetic spacer layer 16 is conductive. The AFM layer 12 is used to fix, or pin, the magnetization of the pinned layer 14 in a particular direction. The magnetization of the free layer 18 is free to rotate, typically in response to an external magnetic field. The conventional magnetic element 10' depicted in FIG. 1B is a spin tunneling junction. Portions of the conventional spin tunneling junction 10' are analogous to the conventional spin valve 10. However, the conventional barrier layer 16' is an insulator that is thin enough for electrons to tunnel through in a conventional spin tunneling junction 10'. Note that only a single spin valve 10 is depicted, one of ordinary skill in the art will readily recognize that dual spin valves including two pinned layers and two nonmagnetic layers separating the pinned layers from the free layer can be used. Similarly, although only a single spin tunneling junction 10' is depicted, one of ordinary skill in the art will readily recognize that dual spin tunneling including two pinned layers and two barrier layers separating the pinned layers from the free layer, can be used. More recently, structures having two pinned layers and two layers, one barrier and one conductive, separating the pinned layers from the free layers have been developed, particularly for use when exploiting spin transfer in programming.

Depending upon the orientations of the magnetization 19/19' of the conventional free layer 18/18' and the conventional pinned layer 14/14', respectively, the resistance of the conventional magnetic element 10/10', respectively, changes. When the magnetization 19/19' of the conventional free layer 18/18' is parallel to the magnetization of the conventional pinned layer 14/14', the resistance of the conventional magnetic element 10/10' is low. When the magnetization 19/19' of the conventional free layer 18/18' is antiparallel to the magnetization of the conventional pinned layer 14/14', the resistance of the conventional magnetic element 10/10' is high.

To sense the resistance of the conventional magnetic element 10/10', current is driven through the conventional magnetic element 10/10'. Typically in memory applications, current is driven in a CPP (current perpendicular to the plane) configuration, perpendicular to the layers of conventional magnetic element 10/10' (up or down, in the z-direction as seen in FIG. 1A or 1B). Based upon the change in resistance, typically measured using the magnitude of the voltage drop across the conventional magnetic element 10/10', the resistance state and, therefore, the data stored in the conventional magnetic element 10/10' can be determined.

FIG. 2 depicts a conventional MRAM 50 that uses the magnetic element 10 or 10'. The MRAM 50 includes the magnetic element 10/10', bit line 52 and word line 54. In conventional MRAM, the conventional magnetic element 10/10' is written using an in-plane magnetic field that is approximately forty-five degrees from the axis in which the magnetization 19/19' lie. This magnetic field is typically provided by driving current through two write lines, the bit line 52 and the word line 54, which are oriented perpendicular and which cross in the region of the conventional magnetic element 10/10'. Current driven in the bit line 52 generates a magnetic field that is parallel or antiparallel to the magnetization of the free layer 18/18'. Current driven in the word line 54 generates a magnetic field that is perpendicular to the magnetization 19/19' of the free layer 18/18'. This magnetic field reduces the field required to be generated by current in the bit line 52 to switch the direction of magnetization 19/19' of the free layer 18/18'. Thus, the sum of the two magnetic fields generated by currents in the lines 52 and 54 allows the magnetization 19/19' to be switched. Depending upon the direction of the magnetic field, the magnetization 19/19' of the free layer 18/18' can be switched to have an equilibrium position parallel or antiparallel to the magnetization of the pinned layer 14/14'.

Although the conventional magnetic elements 10/10' can be used to store data in an MRAM, one of ordinary skill in the art will readily recognize that there are a number of drawbacks. Of these, the primary issues include poor write selectivity and a high write current required to write to the conventional magnetic elements 10/10'. Typically, a magnetic cell includes the conventional magnetic element 10/10' and other element(s), such as a selection transistor. Poor write selectivity results in memory cells in addition to the desired memory cell being written. These unintentionally written cells are typically located in the regions that either the bit line or word line has passed current through so that the cells encounter magnetic field that the current generates. During manufacturing, defects may be introduced into elements within the memory cells to form pinning sites of magnetization. Manufacturing also results in variations in the size and shape of the conventional magnetic elements 10/10', as well as other portions of the memory cell. The pinning sites usually cause local sub-domain formation and drag the magnetization switching. It essentially broadens the switching field distribution. The variations in the memory cell size and shape cause variations in the internal demagnetizing field. The magnetic field produced within the memory cell (internal magnetic field) may vary widely from cell to cell. The variations in the internal magnetic field mean that the magnetic field required to switch the free layer magnetization 19/19' of a particular magnetic cell (required write field) varies from cell to cell. Variations in the required write field mean that unintentional switching could happen for those cells with lower switching fields (required write fields) even they only encounter a single-direction magnetic field from either bit line or word line current. Consequently, unintentional cell writing may occur. Thus, defects and variations in the memory cell size and shape may result in a large distribution in the required write field and unintentional cell writing. This, in the memory application, makes it hard to find the operation window of the switching currents and causes reliability problems.

Writing to conventional magnetic cells may also require a larger write current, which is undesirable. As the memory application goes for higher capacity and thus higher memory cell density, the cell size needs to be reduced in order to accommodate more cells within limited chip area. On the other hand, while the cell size decreases, the required switching field increases rapidly. A higher applied magnetic field requires a higher current to be driven through the write lines. This higher current is undesirable, for example due to increased power consumption. In addition, for the more advanced technology node, the maximum current that the metal lines could sustain is limited due to the reduced metal line cross-section.

Efforts have been made to address issues, for example in toggle writing. In one scheme, stray fields from unbalanced synthetic layers in a conventional magnetic element 10/10' are used to reduce the switching field. However, one of ordinary skill in the art will recognize that such schemes have drawbacks. For example, stray fields may not be uniform across a cell or among cells. In particular, stray fields at the edges of a memory cell may be quite large. Consequently, a loss of writing integrity may occur. In addition, the stray fields are typically quite sensitive to the shape, size, and wall profile for a magnetic memory element. As a result, the biasing from stray fields may be difficult to control.

Accordingly, what is needed is a system and method for providing a magnetic memory element that can be switched using a lower current and that has improved switching characteristics. The present invention addresses such a need.

BRIEF SUMMARY OF THE INVENTION

The present invention provides a method and system for providing a magnetic memory device. The method and system comprise providing a magnetic element that includes a data storage layer having at least one easy axis in at least a first direction. The method and system also comprise providing a hard bias structure surrounding a portion of the magnetic element. The hard bias structure is also configured to provide at least one hard bias field essentially parallel to the at least the first direction or essentially perpendicular to the at least the first direction.

According to the method and system disclosed herein, the present invention provides a magnetic element having improved switching characteristics and that can be written using a lower current.

DETAILED DESCRIPTION OF THE INVENTION

Figure 1A:
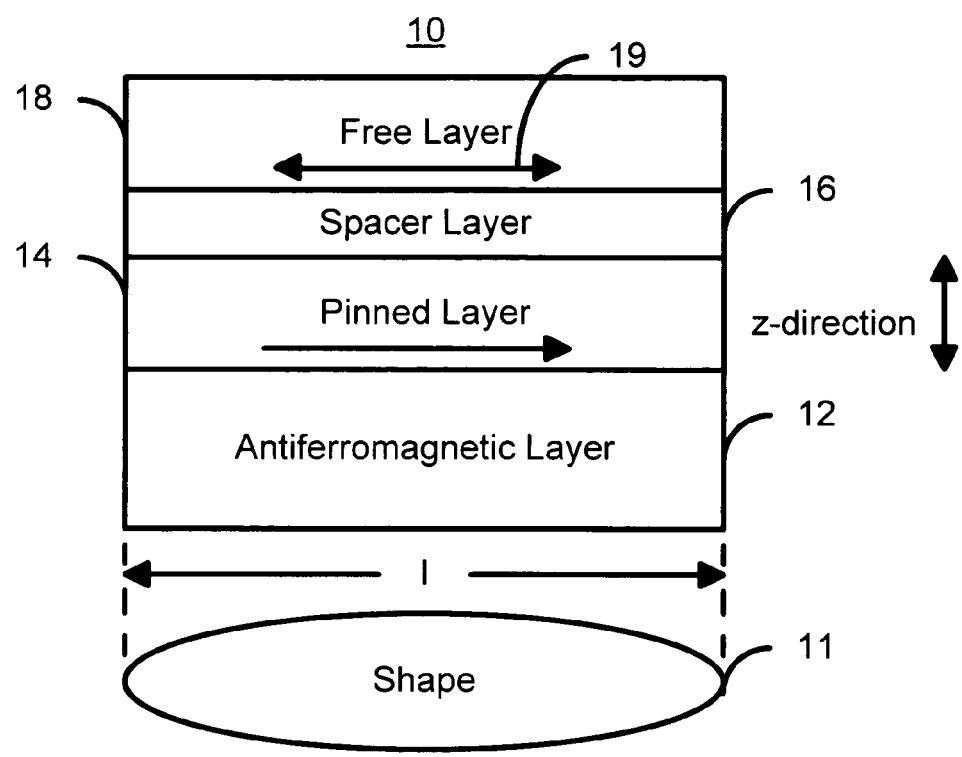
FIG. 1A is a diagram of a conventional magnetic element, a spin valve.
Figure 1B:
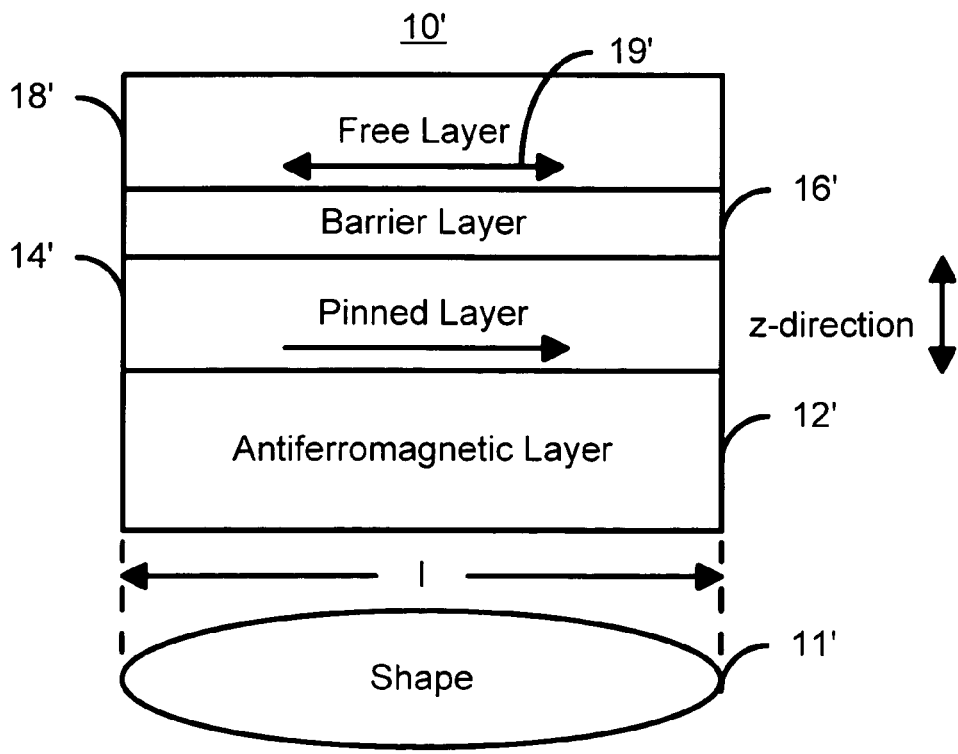
FIG. 1B is a diagram of another conventional magnetic element, a spin tunneling junction.
Figure 2:
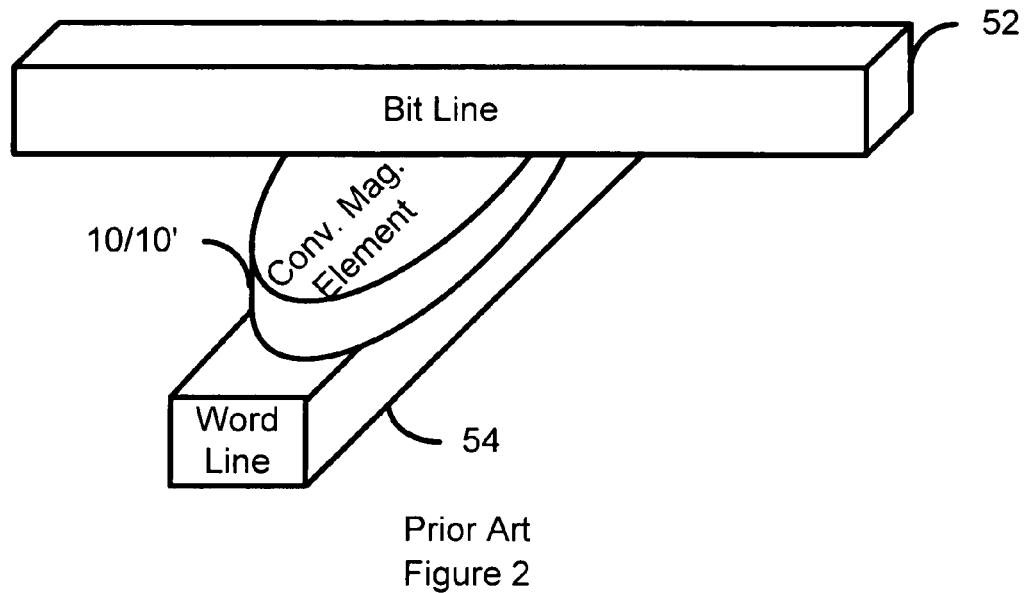
FIG. 2 is a diagram of a conventional magnetic element in a conventional magnetic random access memory.

The present invention relates to magnetic elements and magnetic memories such as MRAM. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein. The present invention is also described in the context of current knowledge for physical phenomenon. However, the present invention is not intended to be limited to specific explanations of physical phenomenon.

The present invention provides a method and system for providing a magnetic memory device. The method and system comprise providing a magnetic element that includes a data storage layer having at least one easy axis in at least a first direction. The method and system also comprise providing a hard bias structure surrounding a portion of the magnetic element. The hard bias structure is also configured to provide at least one hard bias field essentially parallel to the at least the first direction or essentially perpendicular to the at least the first direction.

The present invention will be described in terms of a particular magnetic memory and a particular magnetic element having certain components. However, one of ordinary skill in the art will readily recognize that this method and system will operate effectively for other magnetic memory elements having different and/or additional components and/or other magnetic memories having different and/or other features and/or shapes not inconsistent with the present invention. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the present invention is described in the context of magnetic elements having particular layers. However, one of ordinary skill in the art will readily recognize that magnetic elements having additional and/or different layers not inconsistent with the present invention could also be used. Moreover, certain components are described as being ferromagnetic or magnetic. However, as used herein, the term ferromagnetic or magnetic could include ferrimagnetic or like structures. Thus, as used herein, the term "ferromagnetic" includes, but is not limited to ferromagnets and ferrimagnets. The present invention is also described in the context of simple layers. However, one of ordinary skill in the art will readily recognize that the present invention is consistent with the use of synthetic layers, for example composed of ferromagnetic layers separated by conductive nonmagnetic layer(s). One of ordinary skill in the art will also recognize that the magnetizations of the ferromagnetic layers in such synthetic layers may or may not be balanced (equal and opposite). The present invention is also described in the context of specific directions, for example for the applied field and magnetic bias. However, one of ordinary skill in the art will readily see that other combinations of directions may be used for the applied magnetic field.

Figure 3:
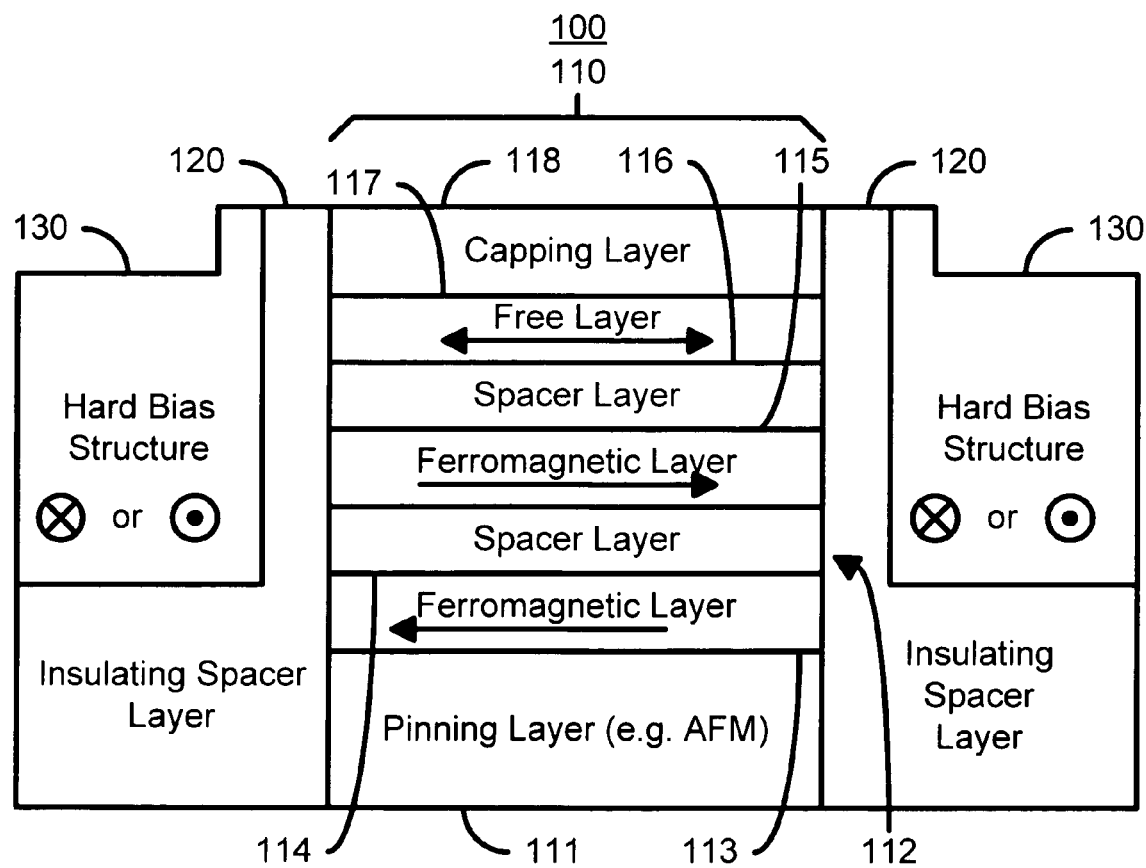
FIG. 3 is a diagram of one embodiment of a magnetic memory device in accordance with the present invention having improved switching characteristics.
Figure 4:
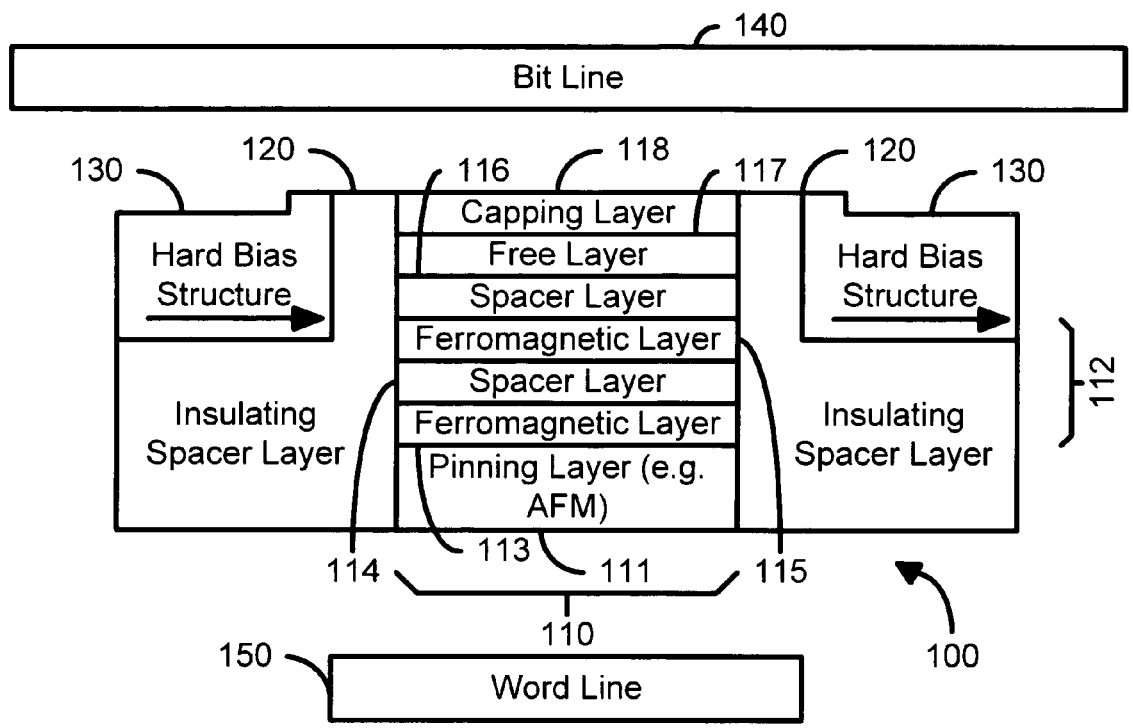
FIG. 4 is a side view of one embodiment of a magnetic memory device in accordance with the present invention within a magnetic memory.
Figure 5:
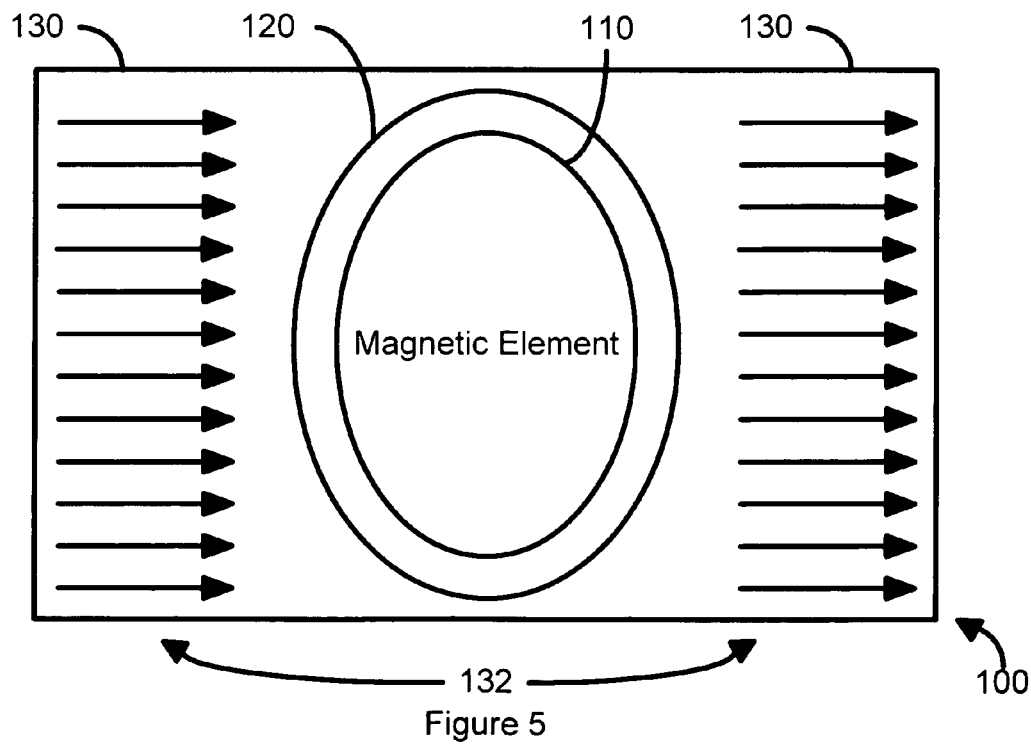
FIG. 5 is a top view of one embodiment of a magnetic memory device and hard biasing field in accordance with the present invention.

To more particularly describe the present invention, refer to FIGS. 3–5. FIG. 3 is a diagram of one embodiment of a magnetic memory device 100 in accordance with the present invention having improved switching characteristics. FIGS. 4 and 5 are side and top views, respectively, of one embodiment of the magnetic memory device 100 in accordance with the present invention within a magnetic memory having bit line 140 and word line 150. The magnetic memory device 100 includes a magnetic element 110, hard bias structure 130, and preferably a spacer layer that is preferably an insulating layer 120.

The magnetic element 110 preferably includes at least a free layer 117, a spacer layer 116, and a pinned layer 112. In the embodiment shown, the pinned layer 112 is a synthetic pinned layer including ferromagnetic layers 113 and 115 separated by a nonmagnetic spacer layer 114. The magnetic element 110 also preferably includes a pinning layer 111 and a capping layer 118. The magnetic 110 may also include seed layer(s) (not shown). The pinning layer 112 is preferably an AFM. In a preferred embodiment, ferromagnetic layers 113 and 115 of the pinned layer 112 each preferably includes a CoFe alloy, Co, Permalloy, or other materials having similar parameters. The direction of the magnetization of the ferromagnetic layer 113 is strongly coupled, or pinned, by the pinning layer 112, preferably through an exchange bias. The nonmagnetic spacer layer 114 separates the pinned layer 113 from the pinned layer 115. In a preferred embodiment, the nonmagnetic spacer layer 114 is composed of Cr, Mn, Ir, Ru or other materials having similar characteristics. The thickness of the nonmagnetic spacer layer 114 is preferably selected such that the ferromagnetic layers 113 and 115 are magnetically coupled.

The spacer layer 116 may, for example, be a conductor such as Cu or may be an insulator, such as alumina or MgO. In a preferred embodiment, the spacer layer 116 is insulating. If insulating, the spacer layer 116 is preferably a tunneling barrier layer, which allows tunneling of electrons between the free layer 117 and the pinned layer 112. The spacer layer 116 is also configured such that the free layer 117 is not exchange coupled to the pinned layer 112.

The free layer 117 is ferromagnetic. In a preferred embodiment, the free layer 117 includes a CoFe alloy, Co, Permalloy, or other materials having similar parameters. In addition, as discussed above, the free layer 117 is not exchange coupled with the pinned layer 112. In addition, although not shown in FIG. 3, at least the free layer 117, and preferably the entire magnetic element 110 has an anisotropy that ensures that the equilibrium magnetization of the free layer 117 has a preferred direction. Stated differently, the free layer 117 preferably has an easy axis. In a preferred embodiment, the easy axis is due to a shape anisotropy. Thus, the free layer 117, and preferably the entire magnetic element 110, is preferably elliptical in shape, with the easy axis of the of the free layer 117 residing along the long axis of the ellipse. However, in another embodiment, the free layer 117 and/or the magnetic element 110 may have a different shape.

The magnetic memory device 100 also includes a hard bias structure 130 that is preferably separated from the magnetic element 110 by an insulating layer 120. The insulating layer 120 may include materials such as $SiO_x$, $AlO_x$, and/or $SiN_x$. The hard bias structure 130 is preferably a layer of hard bias material. The hard bias structure 130 substantially surrounds a portion of the magnetic element 110. As can be seen in FIG. 3, the hard bias structure 130 preferably substantially surrounds the sides of the free layer 117. The hard bias structure 130 provides a bias field that is preferably in one of two directions. In the embodiment depicted in FIG. 3, the bias field is essentially perpendicular to the easy axis of the free layer 117. In another embodiment, particularly one used in conjunction with toggle switching (described below), the bias field is essentially parallel to the easy axis of the magnetic element 110. However, as depicted in FIG. 5, in the embodiment shown in FIGS. 3–5, the hard bias field 132 generated by the hard bias structure 130 is preferably perpendicular to the long axis of the magnetic element 110. The hard bias field 132 is preferably constant, regardless of whether the magnetic element 110 is being written, read, or quiescent. In addition, the hard bias field 132 is preferably uniform at least across the free layer 117. In the embodiment shown, the hard bias field 132 is uniform not only across the magnetic element 110, but also through the hard bias structure 130. The hard bias structure 130 may include materials such as CoCrPt or CoPt.

In operation, the hard bias structure 130 provides the hard bias field 132 that is in addition to the field that generated by the current flowing through lines 140 and 150. The hard bias field 132 essentially reduces the necessary field/current that is needed for the writing. In particular, the lines 140 and 150 generate perpendicular magnetic fields. The magnetic field perpendicular to the long axis of the magnetic element 110 and generated by the word line 150 adds with the hard bias field 132 when writing to the magnetic element 110. Consequently, the write current required for switching the magnetization of the free layer 117 is reduced.

Figure 6:
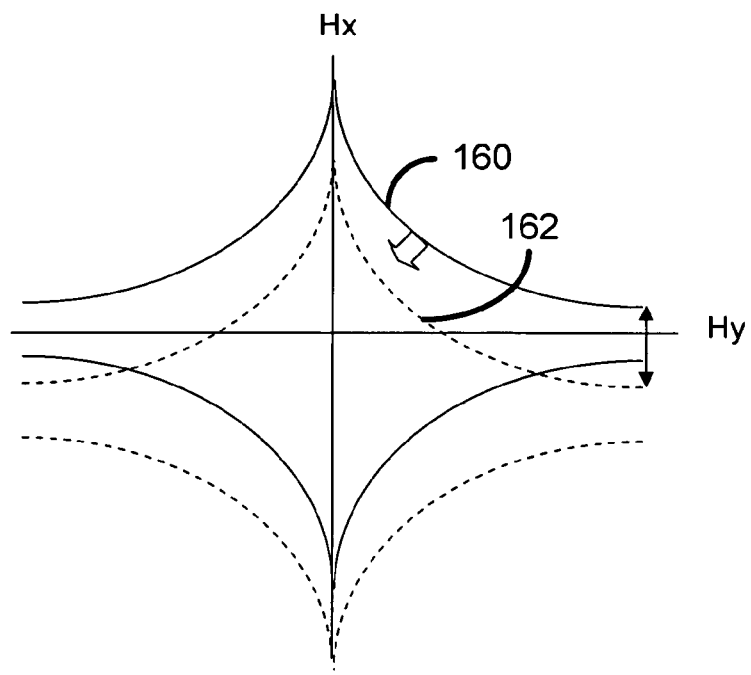
FIG. 6 is a diagram depicting astroid curves for one embodiment of the magnetic memory device in accordance with the present invention.

The lower write current for the magnetic element 110 of the magnetic device 100 may be explained as follows. For explanatory purposes, the required write field is determined for a Stoner-Wohlfarth model of single-domain particle with uniaxial anisotropy. The switching of such particle is often described via "switching astroid"—closed curve in ($H_x$, $H_y$) coordinate system describing the magnetization state of the cell under the influence of applied field. FIG. 6 is a diagram depicting astroid curve 162 for one embodiment of the magnetic memory device in accordance with the present invention. Also shown in FIG. 6 is the astroid curve 160 for the magnetic element 110 in the absence of the hard bias structure 130.

When the applied field is such that the point describing it is located inside the astroid 162, the magnetization of the cell can be in one of the two states and is not changed due to the applied fields. In contrast, when the point corresponding to applied field is located outside the astroid 162 the magnetization can be switched according to the direction of the field applied in the easy axis. This can be seen as follows. The magnetization direction can be determined by taking a tangent line from the astroid 162 to the field point. For fields inside the astroid, two tangent lines can be drawn corresponding to two stable states at this field. For fields outside the astroid 162, only one tangent line exists. Consequently, only one stable magnetization state is possible. Thus, in order to switch the magnetization of the cell, it is necessary for the applied field to cross the astroid 162, otherwise the magnetization will return to the same state it was before the application of the field after the field is removed.

From the asteroids 160 and 162 it can also be seen that the required write field is a strong function of direction. The required write field is the highest along the easy or hard axis (x or y axis) and lowest when the field is applied at forty-five degree angle to the easy axis, or approximately forty-five degrees from the $H_x$ and $H_y$ axes. Application of the bias field 132 along the hard axis is equivalent to shifting the whole astroid. This can be seen by the downward shift from the astroid curve 160 to the astroid curve 162. Thus, the presence of the hard bias structure 130, and the resulting hard bias field 132, reduces the magnetic field required to write to the magnetic element 110. A lower required write field means the switching current is lower, decreasing power consumption of the device. Thus, the hard bias structure 130 results in a lower switching current.

For example, the switching threshold along the easy axis for biased MRAM is given by:

$$H_{xc}^b = H_k \left[1 - \left(\frac{H}{H_K}\right)^{\frac{2}{3}}\right]^{\frac{3}{2}}$$

In contrast, the switching threshold for an unbiased magnetic element 10/10' is $H_{xc}=H_K$, where $H_K$ is the effective anisotropy field of the cell, and H is the applied hard-axis field. It is seen that even application of rather small hard-axis field results in large decrease in the switching current. Furthermore, in MRAM recording data, or switching, is generally performed by applying a field at approximately forty-five degrees to the easy axis of the magnetic element. This is achieved by simultaneous application of two magnetic fields, as described above.

The astroids 160 and 162 correspond to an idealized single-domain particle rotating coherently. In reality, however, the astroid shape and size is a strong function of the shape of the element, material parameters, as well as other factors. Consequently, the astroid shape varies within an MRAM array. Use of an operating window around the astroid 162 may ensure that the application of one field does not switch the cells with the smallest values of effective anisotropy field, whereas application of both fields switches the cells with highest values of anisotropy. In this case, the optimal required write field for biased MRAM is again smaller than for a conventional magnetic element. In addition, the well-defined initial magnetization configuration results in smaller distribution in switching astroids over the MRAM array. Consequently, the requirements for determining the operating window may be relaxed. Thus, use of the magnetic memory device 100 may result in a lower current being used for an entire MRAM array.

Figure 7:
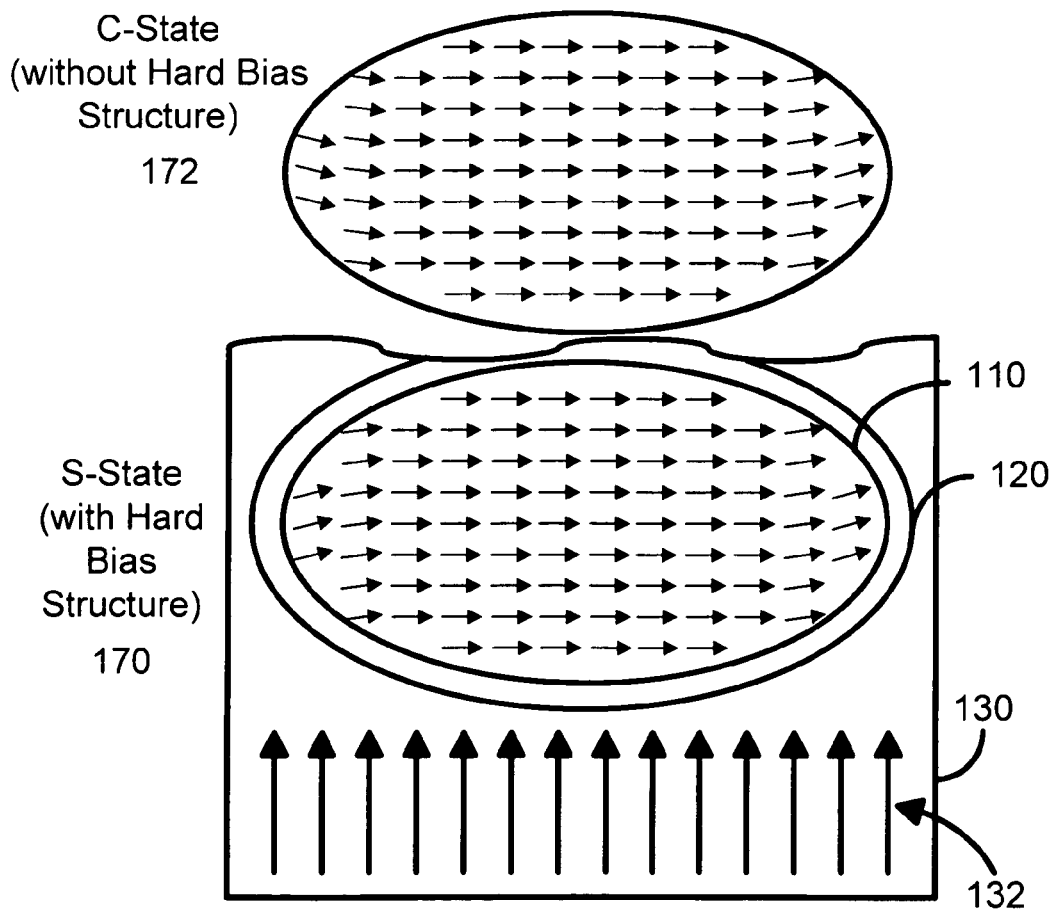
FIG. 7 is a diagram of one embodiment of a magnetic memory device and magnetic states in accordance with the present invention.

In addition, the hard bias structure 130 may result in more consistent switching. This can be seen in FIG. 7, depicting of one embodiment of a magnetic memory device 100' and magnetic states in accordance with the present invention. As can be seen in FIG. 7, there are two possible states, the C-state 172 and the S-state 170, of the magnetic element 110. In the magnetization reversal process, the switching behavior is related to the initial state of magnetization prior switching. In general, there are two typical states of magnetization, which are known as S-state 170 and C-state 172. If the C-state 172 is the initial state, formation of vortices during switching is possible. In general, more energy is required to overcome vortices and perform switching. However, presence of the hard bias structure 130 results in the magnetic element 110 having the S-state 170 as its initial state. Because the hard bias structure 130 preferably provides an uniform and constant bias field 132 that is perpendicular to the easy axis, the initial magnetization state of the magnetic element 110 is the S-state 170. This consistent S-state 170 may enable a consistent switching process and a small switch field distribution.

Although the application of the hard axis bias field improves switching characteristics and lowers the required write current, one of ordinary skill in the art will recognize that there may be consequences of using a hard axis bias field that should be accounted for. In particular, application of the hard axis bias field, in the absence of anything else, may adversely impact the thermal stability of the magnetic element 110. However, an increase in the thickness of the free layer 117 may address this issue.

The effect of the increase in thickness of the free layer 117 on thermal stability can be explained as follows. When the hard axis bias field, $H_y$, is applied to the free layer having shape anisotropy field $H_K$ the thermal stability of the free layer is decreased according to the expression:

$$\Delta(H_y) = \frac{\mu_0 M_S H_K A t}{2 k_B T}\left(1 - \frac{H_y}{H_k}\right)^2$$

where A and t are the area and thickness, respectively, of the free layer 117 and T is operating temperature of the device. Thus, the term due to the applied field, $(1-H_y/H_k)^2$ decreases the thermal stability. One way to compensate for this decrease of thermal stability is to increase the thickness, t, of the free layer 117. The increase in t increases both the volume of the free layer 117 and the anisotropy field $H_K$. In order to obtain simple analytical expression for the thickness increase required to balance the thermal stability decrease due to the hard axis bias field, it is assumed that $H_K$ is proportional to t, which is reasonable for thicknesses of the free layer much smaller than the in-plane size. The requirement of the thermal stability for the biased free layer and the unbiased free layers to be the same can be expressed as $$\frac{\mu_0 M_S H_{KO} t^2 A}{2k_B T t_0}\left(1 - \frac{H_y}{H_{KO}}\frac{t_0}{t}\right)^2 = \frac{\mu_0 M_S H_{KO} t_0 A}{2k_B T}$$

where $t_0$ and $H_{KO}$ are the thickness and anisotropy field of the unbiased free layer. This condition gives the following equation to determine the required increase in free layer thickness:

$$\tau^2\left(1 - \frac{h_y}{\tau}\right)^2 = 1$$

where $$\tau = \frac{t}{t_0} \text{ and } h_y = \frac{H_y}{H_{KO}}.$$

Solving for T results in:

$$\tau = h_y + 1 \text{ or } t = t_0\left(\frac{H_y}{H_{KO}} + 1\right)$$

A free layer with thickness t will have the same thermal stability as the unbiased free layer with thickness $t_0$. The change in the required write field for hard axis biased free layer with increased thickness to maintain the thermal stability can be found from the switching astroid equation:

$$H_x(H_y) = H_K\left(1 - \left(\frac{H_y}{H_K}\right)^{\frac{2}{3}}\right)^{\frac{3}{2}}$$

where the anisotropy field of the hard axis biased free layer 117 with increased thickness is related to the anisotropy field of unbiased free layer with thickness to as follows:

$$H_k = \frac{t}{t_0}H_{KO} = \tau H_{KO}$$

Consequently, the required write field for a biased free layer 117 can be written:

$$H_x(H_y) = H_{KO}\left[\left(\frac{H_y}{H_{KO}} + 1\right)^{\frac{2}{3}} - \left(\frac{H_y}{H_{KO}}\right)^{\frac{2}{3}}\right]^{\frac{3}{2}}$$

Figure 8:
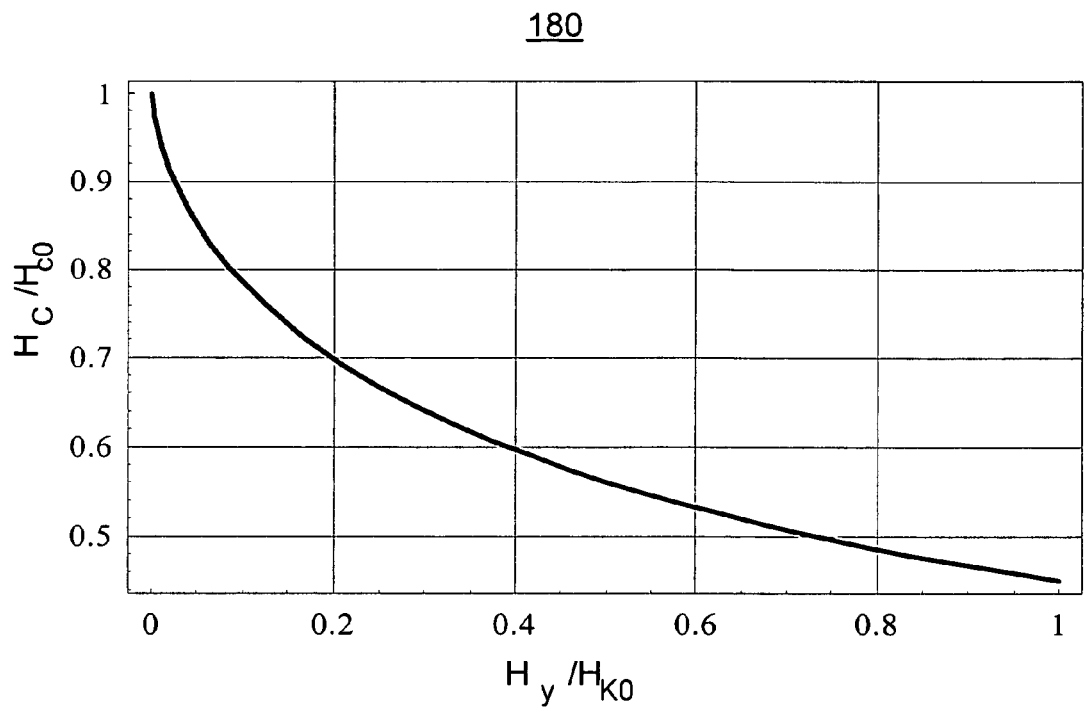
FIG. 8 is a diagram of the dependence of coercivity of the free layer formed in accordance with the present invention on the applied hard-axis field.

Consequently, the coercivity of the free layer is:

$$H_c(H_y) = H_{c0}\left[\left(\frac{H_y}{H_{KO}} + 1\right)^{\frac{2}{3}} - \left(\frac{H_y}{H_{KO}}\right)^{\frac{2}{3}}\right]^{\frac{3}{2}}$$

where $H_{c0}$ is the coercivity of the unbiased free layer. This coercivity is related to the anisotropy field by Sharrock's formula:

$$H_{c0} = H_{KO}\left[1 - \sqrt{\frac{1}{\Delta}\log\frac{f_0 t_p}{\log 2}}\right] \quad (10)$$

where $f_0$ is the activation frequency, $t_p$ is the required write field pulse width. The results of this are drawn in the graph 180 of FIG. 8. Thus application of hard-axis field may cause a large decrease in required write field with the same thermal factor.

Figure 9:
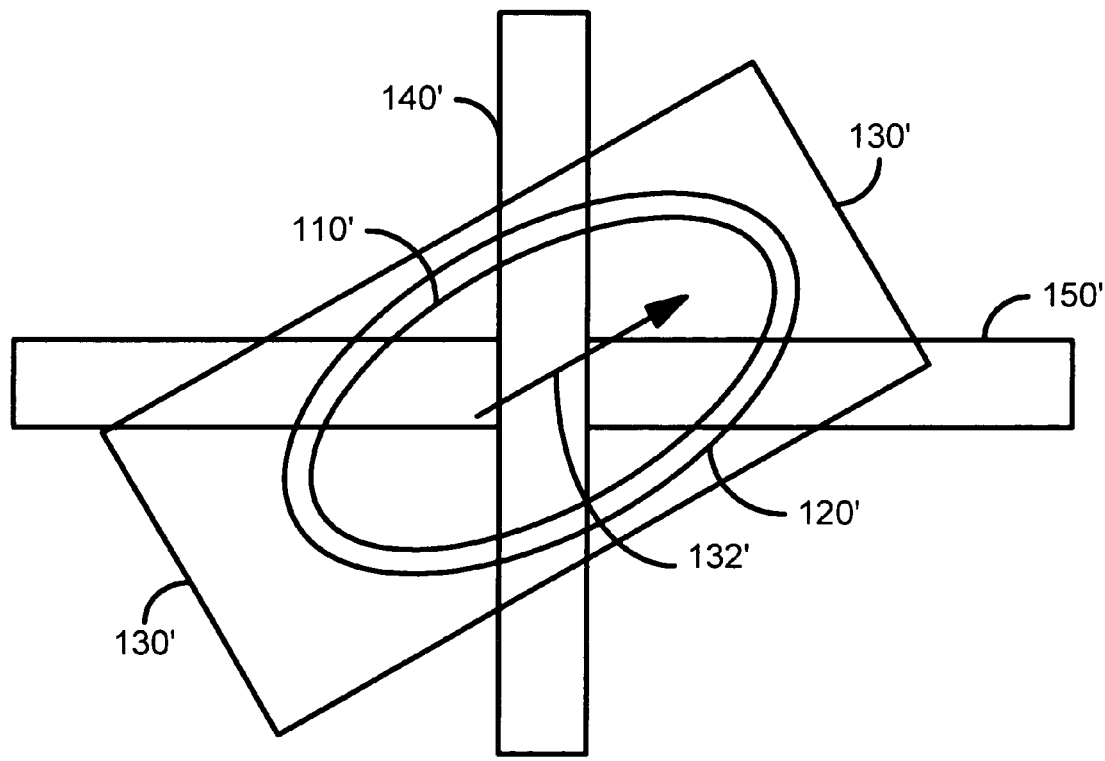
FIG. 9 depicts another embodiment of a magnetic memory device in accordance with the present invention used in toggle switching.
Figure 10:
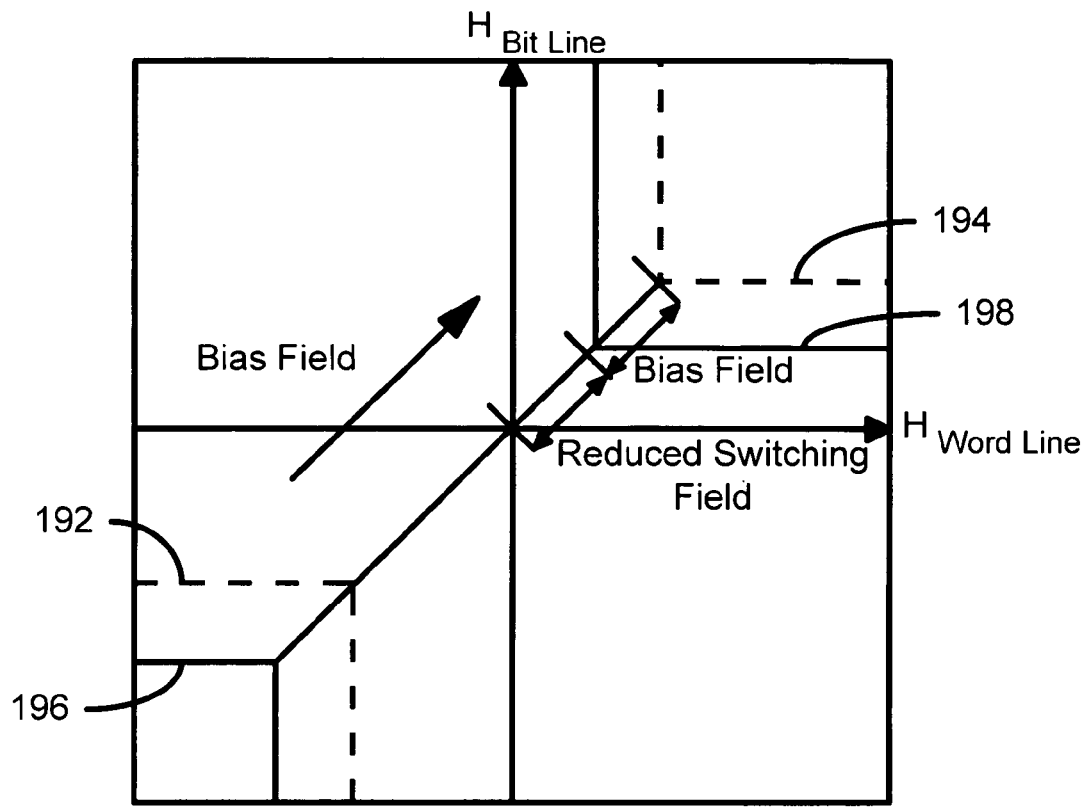
FIG. 10 depicts an astroid curves for one embodiment of the magnetic memory device in accordance with the present invention using toggle switching.

FIG. 9 depicts another embodiment of a magnetic memory device 100' in accordance with the present invention preferably used in toggle switching. The magnetic memory device 100' is analogous to the magnetic memory device 100. Consequently, analogous components are labeled similarly. Consequently, the magnetic memory device 100' includes magnetic element 110', hard bias structure 130' and, preferably, insulating layer 120'. Also depicted are bit line 140' and word line 150'. In order to reduce the switching field, the biasing field 132' may be applied on the easy axis of the free layer magnetization. The biasing field 132' is, therefore, parallel or anti-parallel to the magnetization of free layer. The astroid curve for the toggle writing scheme is shifted in manner shown by the astroid curves in the diagram 190 of FIG. 10. The astroid curves 192 and 194 represent the magnetic element 110" without the bias structure 130''', while the astroid curves 196 and 198 represent the magnetic element 110" in the present with the hard bias structure 130". The shifted amount equals to the biasing field. Thus, the magnetic memory device 100' is preferably used for magnetic memories in which toggle writing is to be employed. Consequently, the magnetic memory device 100' may still have improved switching characteristics and may be switched at a lower write current.

Figure 11:
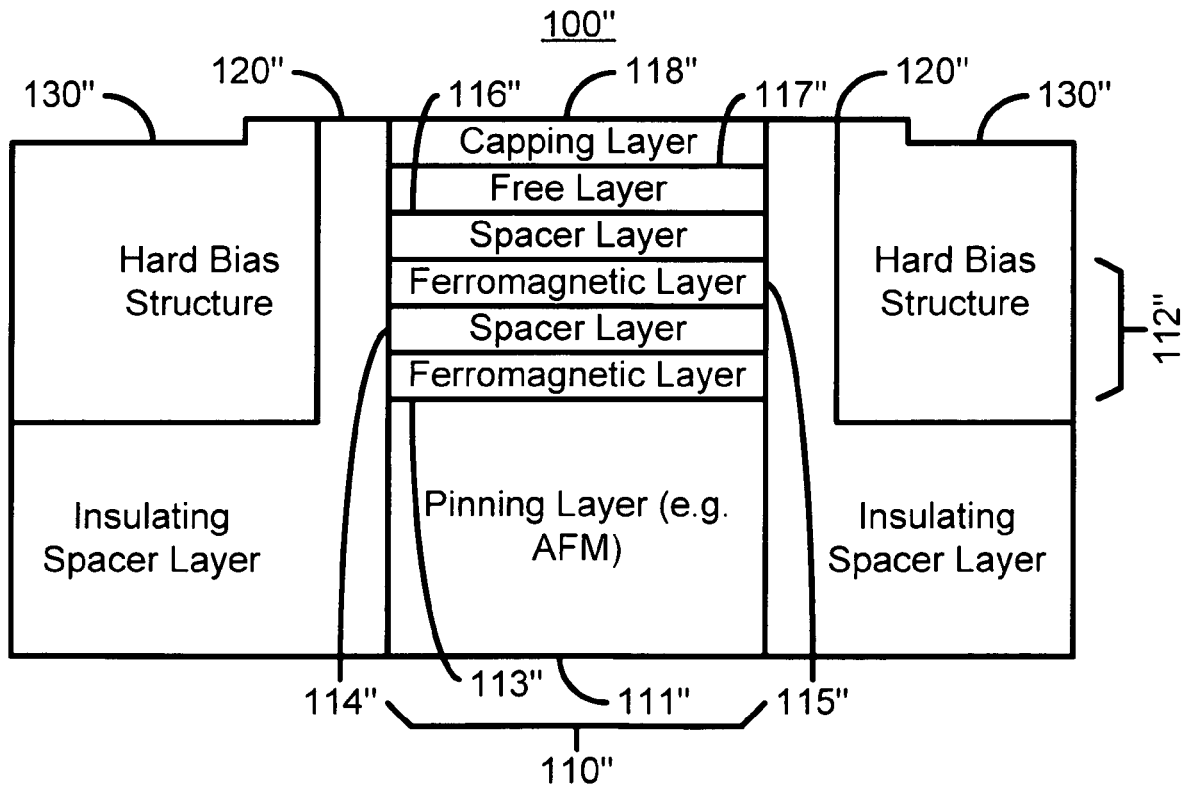
FIG. 11 depicts another embodiment of a magnetic memory device in accordance with the present invention.
Figure 12:
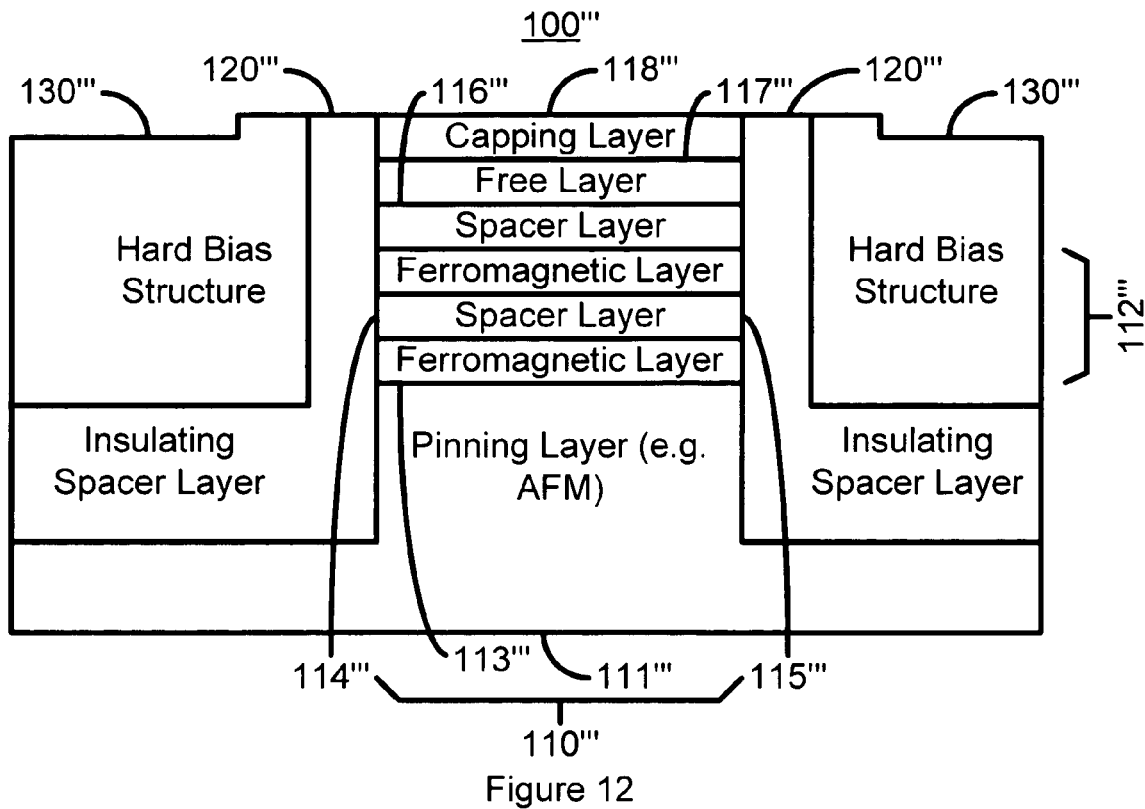
FIG. 12 depicts another embodiment of a magnetic memory device in accordance with the present invention.

FIGS. 11–12 depict other embodiments of a magnetic memory device 100" and 100''' in accordance with the present invention. The magnetic memory devices 100" and 100''' are analogous to the magnetic memory device 100. Consequently, analogous components are labeled similarly. Consequently, the magnetic memory device 100" includes magnetic element 110", hard bias structure 130" and, preferably, insulating layer 120". In addition, the magnetic element 110" includes pinning layer 111", pinned layer 112" having ferromagnetic layers 113" and 115" separated by nonmagnetic conductive spacer layer 114", spacer layer 116", free layer 117" and capping layer 118" and may include seed layer(s) (not shown). Similarly, the magnetic memory device 100''' includes magnetic element 110''', hard bias structure 130''' and, preferably, insulating layer 120'''. In addition, the magnetic element 110" includes pinning layer 111''', pinned layer 112''' having ferromagnetic layers 113''' and 115''' separated by nonmagnetic conductive spacer layer 114''', spacer layer 116''', free layer 117''' and capping layer 118''' and may include seed layer(s) (not shown).

The hard bias field 132 can be adjusted through optimizing the thickness of the insulating spacer 120, 120', 120", or 120''' and the hard bias layer 130, 130', 130", or 130'''. The expected biasing field is in the range of tens of Oersteds. However, in another embodiment, the range may be different. In a preferred embodiment, the biasing field 132 is proportional to the product of remanent magnetization and the thickness of the hard bias layer 130, 130', 130", or 130'''.

On the other hand, the hard bias field 132 decreases as the thickness of the insulating layer 120, 120', 120" or 120''' increases. By tuning the insulating layer 120" or 120''' thickness and hard bias structure 130, 130', 130" and 130''' thickness, a desired biasing field to the free layer may be achieved.

For example, FIGS. 11 and 12 depict mechanisms used to obtain the desired hard bias field. In a preferred embodiment, the vertical alignment of the hard bias layer 130"/130''' to the free layer 117"/117''' is tailored. In particular, the top of the hard bias layer 130"/130''' is desired to be above the top of the free layer 117"/117''' to improve the uniformity of the bias field 132 across the free layer 117"/117'''. In the magnetic memory device 100", the thickness of both the insulating layer 120" and the hard bias structure 130" are increased. The hard bias field 132 could be maintained at a relatively constant value if the combination of the thickness of insulating layer 120" and the hard bias structure 130" is constant. Alternatively, as shown in FIG. 12, the magnetic element 110''' may be etched to reduce the vertical distance from the free layer 117''' to the base of the insulating layer 120''' is thus reduced. The hard bias structure 130''' may then be aligned with the free layer 117''' while still utilizing a thinner insulating layer 120'''.

Thus, magnetic memory devices 100, 100', 100", and 100''' may have a lower write current and more uniform write characteristics. For a thicker free layer, these benefits may be achieved without sacrificing thermal stability.

Figure 13:
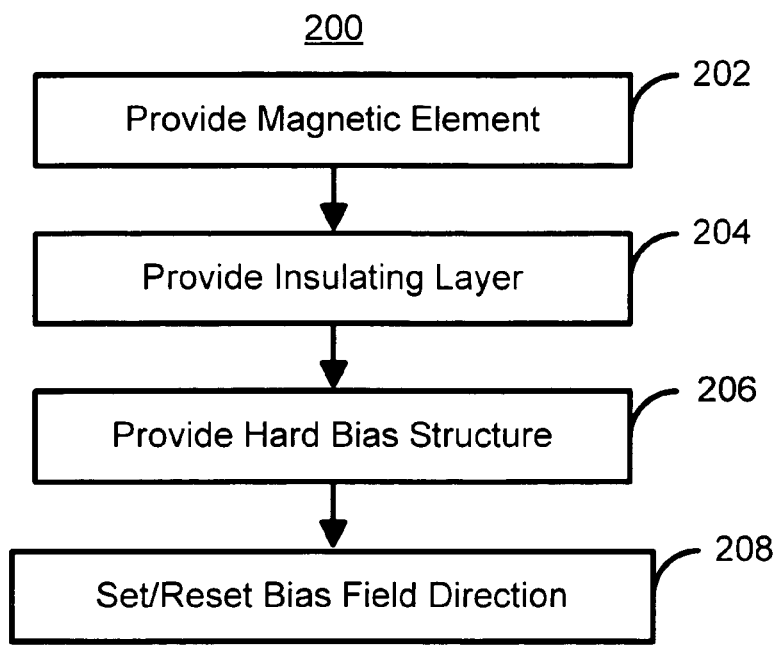
FIG. 13 is a flow chart depicting one embodiment of a method for providing a magnetic memory device in accordance with the present invention having improved switching characteristics.

FIG. 13 is a flow chart depicting one embodiment of a method 200 for providing a magnetic memory device in accordance with the present invention having improved switching characteristics. The magnetic element 110/110'/110"/110''' is provided, via step 202. The insulating layer 120/120'/120"/120''' is provided, via step 204. The hard bias structure 130/130'/130"/130''' is also provided, via step 206. The direction of magnetization of the hard bias structure 130/130'/130"/130''' and, therefore, the direction of the hard bias layer 132/132'/132"/132''' are set, via step 208. In a preferred embodiment, step 208 is performed after other thermal processes in fabricating the magnetic device 100/100'/100"/100''' have completed in order to account for any changes in magnetization direction during fabrication. Step 208 preferably includes aligning the magnetization of the hard bias structure 130/130'/130"/130''' in a field having a magnitude significantly higher than the coercivity of the hard bias structure 130/130'/130"/130''' and in a desired direction for the hard bias field 120/120'/120"/120'''.

Figure 14:
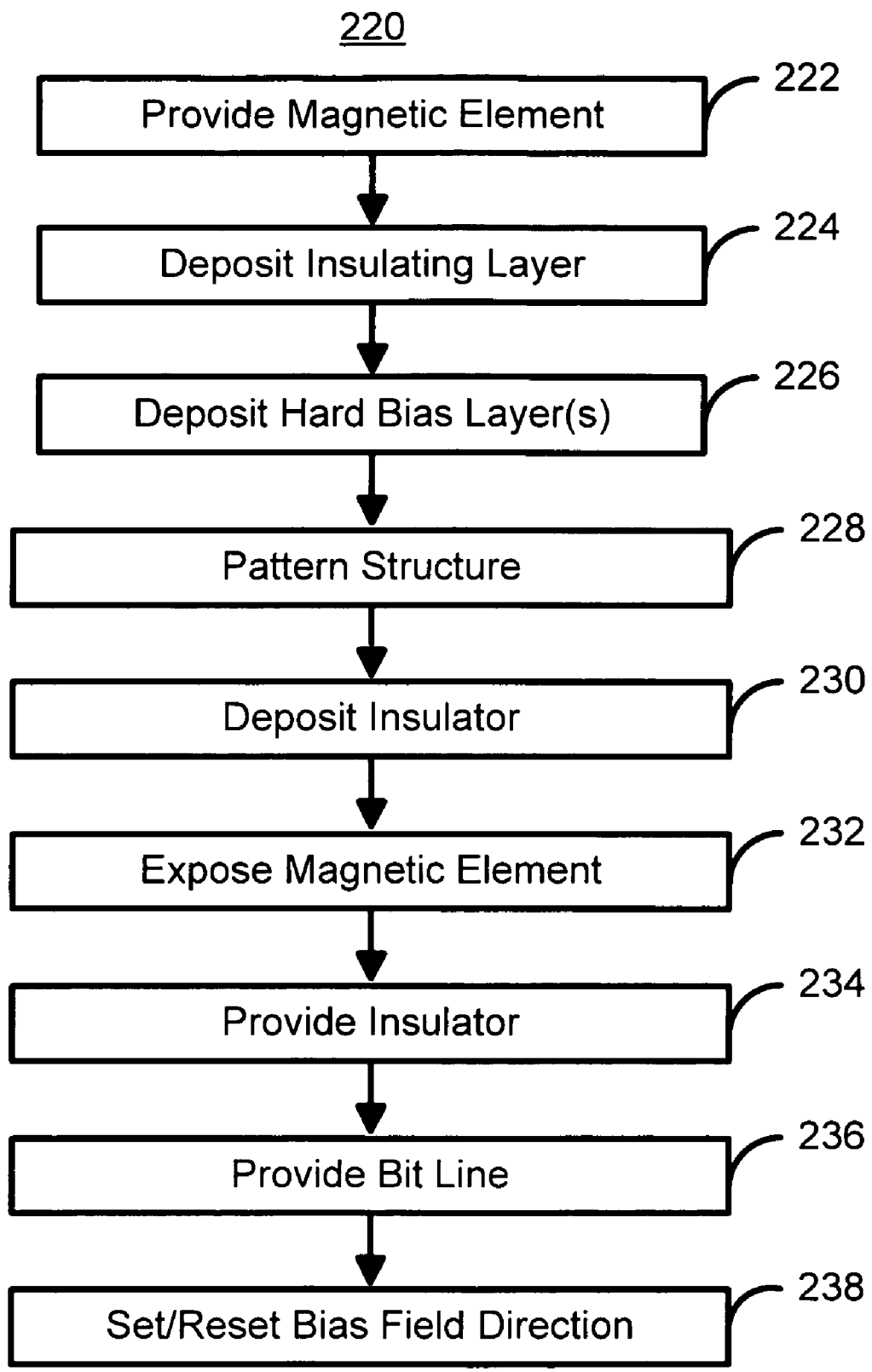
FIG. 14 is a flow chart depicting another embodiment of a method for providing a magnetic memory device in accordance with the present invention having improved switching characteristics.

FIG. 14 is a flow chart depicting another embodiment of a method 220 for providing a magnetic memory device in accordance with the present invention having improved switching characteristics. The magnetic element 110/110'/110"/110''' is provided, via step 222. Step 222 preferably includes depositing the layers for and patterning the magnetic elements 110/110'/110"/110'''. The insulating layer 120/120'/120"/120''' is provided over the magnetic elements, via step 224. The layer of material for the hard bias structure 130/130'/130"/130''' is deposited, via step 226. The hard bias structure 130/130'/130"/130''' is patterned to the desired size around the magnetic element 110/110'/110"/110''', via step 228. An insulator is deposited on the structure, via step 230. The magnetic element 110/110'/110"/110''' is then exposed, preferably through a chemical mechanical polish (CMP), via step 232. Another insulator is provided, via step 234. The bit line 140 is also provided, via step 236. The direction of the hard bias field 132 is then reset, via step 238. The resetting refreshes the direction of the bias field 132 of the hard bias layer 130/130'/130"/130''' in the event that the magnetization of the hard bias layer 130/130'/130"/130''' was disturbed during fabrication. After the initialization procedure, the bias field 132 may be more consistent and uniform. Typically the resetting process in step 238 involves an alignment field higher than the coercivity field of the hard bias layer, the process time could be less than one minute. Thus, the magnetic memory device 100, 100', 100", and/or 100''' may be provided and their benefits achieved.

A method and system for providing a magnetic element that has improved switching characteristics and a reduced required write current have been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A magnetic memory device comprising:
   a magnetic element including a data storage layer having at least one easy axis in at least a first direction; and
   a hard bias structure surrounding a portion of the magnetic element and configured to provide at least one hard bias field essentially parallel to the at least the first direction or essentially perpendicular to the at least the first direction.

2. The magnetic memory device of claim 1 further comprising:
   an insulating layer sandwiched between the portion of the magnetic element and the hard bias structure.

3. The magnetic memory device of claim 1 wherein the hard bias field is configured to ensure that the data storage layer has a first equilibrium state.

4. The magnetic memory device of claim 1 wherein the magnetic element further includes a pinned layer and a spacer layer, the data storage layer being a free layer, the spacer layer residing between the pinned layer and the free layer.

5. The magnetic memory device of claim 4 wherein the spacer layer is conductive.

6. The magnetic memory device of claim 4 wherein the spacer layer is a tunneling barrier layer.

7. The magnetic memory device of claim 4 wherein the pinned layer is a synthetic pinned layer including at least a first ferromagnetic layer, a second ferromagnetic layer, and a conductive nonmagnetic spacer layer between the first ferromagnetic layer and the second ferromagnetic layer.

8. The magnetic memory device of claim 4 wherein the free layer is a synthetic free layer including at least a first ferromagnetic layer, a second ferromagnetic layer, and a conductive nonmagnetic spacer layer between the first ferromagnetic layer and the second ferromagnetic layer.

9. The magnetic memory device of claim 4 wherein the free layer has a top surface and the hard bias structure has a top surface, the top surface of hard bias structure residing higher than the top surface of free layer.

10. The magnetic memory device of claim 1 wherein the at least one hard bias field is essentially perpendicular to the at least the direction.

11. The magnetic memory device of claim 1 wherein the at least one hard bias field is essentially parallel to the at least the direction.

12. The magnetic memory device of claim 11 wherein the data storage layer is configured to be written using a toggle writing scheme.

13. The magnetic memory device of claim 1 wherein the hard bias field is substantially uniform across the data storage layer.

14. A magnetic memory comprising:
a plurality of magnetic elements, each of the plurality of magnetic elements including a data storage layer having at least one easy axis in at least a first direction; and
at least one hard bias structure surrounding a portion of each of the plurality of magnetic elements and configured to provide at least one hard bias field essentially parallel to the at least the first direction or essentially perpendicular to the at least the first direction.

15. The magnetic memory of claim 14 wherein each of the plurality of magnetic elements further includes an insulating layer sandwiched between the portion of the magnetic element and the hard bias structure.

16. The magnetic memory of claim 14 wherein the hard bias field is configured to ensure that the data storage layer has a first equilibrium state.

17. The magnetic memory of claim 14 wherein each of the plurality of magnetic elements further includes a pinned layer and a spacer layer, the data storage layer being a free layer, the spacer layer residing between the pinned layer and the free layer.

18. The magnetic memory of claim 17 wherein the spacer layer is conductive.

19. The magnetic memory of claim 17 wherein the spacer layer is a tunneling barrier layer.

20. The magnetic memory of claim 17 wherein the pinned layer is a synthetic pinned layer including at least a first ferromagnetic layer, a second ferromagnetic layer, and a conductive nonmagnetic spacer layer between the first ferromagnetic layer and the second ferromagnetic layer.

21. The magnetic memory of claim 17 wherein the free layer is a synthetic free layer including at least a first ferromagnetic layer, a second ferromagnetic layer, and a conductive nonmagnetic spacer layer between the first ferromagnetic layer and the second ferromagnetic layer.

22. The magnetic memory of claim 17 wherein the free layer has a top surface and the hard bias structure has a top surface, the top surface of the hard bias structure residing higher than the top surface of the free layer.

23. The magnetic memory of claim 14 wherein the at least one hard bias field is essentially perpendicular to the at least the direction.

24. The magnetic memory of claim 14 herein the at least one hard bias field is essentially parallel to the at least the direction.

25. The magnetic memory of claim 24 wherein the data storage layer is configured to be written using a toggle writing scheme.

26. The magnetic memory of claim 14 wherein the hard bias field is substantially uniform across the data storage layer.

27. A method for providing magnetic memory device comprising:
providing a magnetic element including a data storage layer having at least one easy axis in at least a first direction;
providing a hard bias structure surrounding a portion of the magnetic element and configured to provide at least one hard bias field essentially parallel to the at least the first direction or essentially perpendicular to the at least the first direction; and
setting the hard bias field to be essentially in the at least the first direction or essentially perpendicular to the at least the first direction.

28. The method of claim 27 further comprising:
providing an insulating layer sandwiched between the portion of the magnetic element and the hard bias structure.

29. The method of claim 27 wherein the data storage layer includes a free layer and wherein the pinned layer providing further includes:
providing a pinned layer; and
providing a spacer layer, the data storage layer being a free layer, the spacer layer residing between the pinned layer and the free layer.

* * * * *